(12) United States Patent
Lee

(10) Patent No.: US 9,401,187 B2
(45) Date of Patent: Jul. 26, 2016

(54) INTEGRATED CIRCUIT AND PRECHARGE/ACTIVE FLAG GENERATION CIRCUIT

(71) Applicant: SK hynix Inc., Gyeonggi-do (KR)

(72) Inventor: Hyun-Sung Lee, Gyeonggi-do (KR)

(73) Assignee: SK Hynic Inc., Gyeonggi-do (KR)

( * ) Notice: Subject to any disclaimer, the term of this patent is extended or adjusted under 35 U.S.C. 154(b) by 0 days.

(21) Appl. No.: 14/555,442

(22) Filed: Nov. 26, 2014

(65) Prior Publication Data

US 2015/0364167 A1 Dec. 17, 2015

(30) Foreign Application Priority Data

Jun. 16, 2014 (KR) ........................ 10-2014-0072855

(51) Int. Cl.
| | | |
|---|---|---|
| G11C 8/00 | (2006.01) | |
| H03K 19/082 | (2006.01) | |
| G11C 7/12 | (2006.01) | |
| G11C 8/12 | (2006.01) | |
| G11C 29/00 | (2006.01) | |
| H03M 9/00 | (2006.01) | |
| H03M 7/16 | (2006.01) | |
| H03M 7/24 | (2006.01) | |
| H03K 19/20 | (2006.01) | |

(52) U.S. Cl.
CPC .. *G11C 7/12* (2013.01); *G11C 8/12* (2013.01); *G11C 29/787* (2013.01); *G11C 29/842* (2013.01); *H03K 19/20* (2013.01); *H03M 7/165* (2013.01); *H03M 7/24* (2013.01); *H03M 9/00* (2013.01)

(58) Field of Classification Search
CPC .......... G11C 7/12; G11C 8/12; G11C 29/787; G11C 8/10; H03K 19/0002; H03K 19/003; H03K 19/20; H03G 7/007; H03M 7/50; H03M 13/1105; H03M 13/1111; H03M 13/1128; H03M 13/1145; H03M 13/37; H03M 13/43

See application file for complete search history.

(56) References Cited

U.S. PATENT DOCUMENTS

| | | | | |
|---|---|---|---|---|
| 3,940,596 A | * | 2/1976 | Paddock | H03K 23/44 326/97 |
| 4,074,228 A | * | 2/1978 | Jonscher | H04L 1/0041 714/758 |
| 4,520,347 A | * | 5/1985 | Campbell, Jr. | H03M 7/04 341/93 |
| 4,593,393 A | * | 6/1986 | Mead | H03M 13/091 714/757 |
| 5,548,270 A | * | 8/1996 | Kim | G06F 7/544 340/146.2 |
| 5,559,453 A | * | 9/1996 | Covino | H03K 19/00323 326/121 |
| 5,995,028 A | * | 11/1999 | Tai | H03M 9/00 341/100 |
| 6,693,569 B2 | * | 2/2004 | Takahashi | H03M 7/20 327/141 |
| 8,183,888 B2 | * | 5/2012 | Swaminathan | H03K 19/20 326/104 |
| 2006/0290386 A1 | | 12/2006 | Lee et al. | |
| 2012/0242370 A1 | | 9/2012 | Park et al. | |

* cited by examiner

*Primary Examiner* — Vibol Tan
(74) *Attorney, Agent, or Firm* — IP & T Group LLP

(57) ABSTRACT

An integrated circuit includes a first stage including first logic gates each of which performs a first logic operation on a corresponding signal among first to $N^{th}$ signals and a first bit of a binary code, and a second stage including second logic gates each of which performs a second logic operation on corresponding output signals of the first logic gates and is reset based on a second bit of the binary code.

14 Claims, 10 Drawing Sheets

INTEGRATED CIRCUIT AND PRECHARGE/ACTIVE FLAG GENERATION CIRCUIT

CROSS-REFERENCE TO RELATED APPLICATIONS

The present application claims priority of Korean Patent Application No. 10-2014-0072855, filed on Jun. 16, 2014, which is incorporated herein by reference in its entirety.

BACKGROUND

1. Field

Various embodiments of the present invention relate to an integrated circuit, and more particularly, to a technology for decoding a binary code and performing a logic operation.

2. Description of the Related Art

In general, binary codes (i.e., encoded signals) are used as an input signal of a semiconductor device to decrease the bit number of the input signal. For example, when 1024 word lines are included in a memory device, 1024 selection signals have to be used to select one word line. However, it may be difficult to transmit/receive 1024 selection signals. Thus, an address formed of a 10-bit binary code is used to transmit/receive selection information.

FIG. 1 shows a logic operation of a binary code and ordinary signals that are not a binary code.

Referring to FIG. 1, the logic operation, e.g., an AND operation or an OR operation, of a 3-bit binary code BCODE<0:2> and 8 ordinary signals S<0> to S<7> may not be directly performed. The 3-bit binary code BCODE<0:2> has to be decoded into 8 signals DEC<0> to DEC<7> by using a decoder 110, and then the decoded 8 signal's DEC<0> to DEC<7> are logically combined with the 8 ordinary signals S<0> to S<7> in a logic operation circuit 120.

FIG. 2 illustrates a circuit for generating a precharge/active flag signal IMPRE_FLAG that is used to support an implicit precharge (imPRE) function in a memory device.

The implicit precharge function of a memory device denotes an operation in which, if a memory bank corresponding to an active command is in a precharge state, an activation operation is directly performed, and if the memory bank corresponding to the active command is not in a precharge state (i.e., if the memory bank is in an active state), a precharge operation is performed first and then an active operation is performed a predetermined time later. For example, where a memory bank 0 included in a memory device is in an active state and a memory bank 1 is in a precharge state, when an active command for the memory bank 0 is applied, the memory bank 0 is precharged and then an active operation is performed on the memory bank 0. Meanwhile, when an active command for the memory bank 1 is applied, an active operation is directly performed on the memory bank 1. That is, when an active command is applied to a memory device, the precharge/active flag signal IMPRE FLAG indicates whether the applied active command corresponds to an active bank or a precharged bank.

Referring to FIG. 2, the circuit for generating the precharge/active flag signal IMPRE_FLAG includes a decoder 210, and a logic operation circuit 220.

The decoder 210 decodes a bank address BA<0:2>, which is a binary code, to generate bank selection signals BS<0:7>. The bank address BA<0:2> is inputted along with an active command, and the bank selection signals BS<0:7> are activated when a corresponding bank is selected. For example, when a bank 3 is selected based on the bank address BA<0:2>, a bank selection signal BS<3> is activated.

The logic operation circuit 220 performs a logic operation on the bank selection signals BS<0:7> and active signals RACT<0:7> to generate the precharge/active flag signal IMPRE_FLAG. The active signals RACT<0:7> represent whether the corresponding bank is in an active state or a precharge state. To take an example when a bank 2 is in an active state, the active signal RACT<2> has a logic high level, and when the bank 2 is in a precharge state, the active signal RACT<2> has a logic low level. When a bank selection signal and a corresponding active signal are activated, in other words, when an active command corresponding to a bank that is in an active state at present is applied, the logic operation circuit 220 activates the precharge/active flag signal IMPRE_FLAG. Otherwise, the logic operation circuit 220 deactivated the precharge/active flag signal IMPRE_FLAG. The fact that the precharge/active flag signal IMPRE_FLAG is activated means that although an active command is applied to the memory device, the active target bank is not in an active state and thus a precharge operation has to be performed prior to an active operation. Meanwhile, the fact that the precharge/active flag signal IMPRE_FLAG is deactivated means that the active target bank is in a precharge state and thus an active operation may be performed immediately.

FIGS. 3A and 3B are detailed diagrams of the logic operation circuit 220 shown in FIG. 2.

FIG. 3A illustrates an example of the logic operation circuit 220. Referring to FIG. 3A, the logic operation circuit 220 includes AND gates 311 to 318 and an OR gate 319. When the corresponding signals are simultaneously activated among the active signals RACT<0:7> and the bank selection signals BS<0:7>, the logic operation circuit 220 activates the precharge/active flag signal IMPRE_FLAG. For example, when the active signal RACT<4> and the bank selection signal BS<4> are simultaneously activated, or when the active signal RACT<6> and the bank selection signal BS<6> are simultaneously activated, the precharge/active flag signal IMPRE_FLAG is activated.

Although the logic operation circuit 220 of FIG. 3A is simple, the multi-input OR gate 319 may not be used in actual applications due to its large fan-in. Furthermore, AND gates are generally implemented by using a NAND gate and an inverter, and OR gates are generally implemented by using a NOR gate and an inverter. Thus, the logic operation circuit 220 may have a structure shown in FIG. 3B.

As described above, binary codes are widely used in semiconductor devices, but the binary codes have to be decoded for the logic operation with other signals. While binary codes go through the decoding process, a delay occurs, and this leads to a delay of a final output signal. Also, since a decoder circuit is required for the decoding process, the circuit area may be increased.

SUMMARY

Various embodiments of the present invention are directed to a circuit structure capable of simultaneously performing a decoding operation of a binary code and a logic operation between the binary code and other signals.

In accordance with an embodiment of the present invention, an integrated circuit may include: a first stage including first logic gates each of which performs a first logic operation on a corresponding signal among first to $N^{th}$ signals and a first bit of a binary code; and a second stage including second logic gates each of which performs a second logic operation on corresponding output signals of the first logic gates and is reset based on a second bit of the binary code.

In accordance with an embodiment of the present invention, an integrated circuit may include: a first logic gate receiving an inverted signal of a first bit of a binary code and a first signal; a second logic gate receiving the first bit of the binary code and a second signal; a third logic gate receiving the inverted signal of the first bit of the binary code and a third signal; a fourth logic gate receiving the first bit of the binary code and a fourth signal; a fifth logic gate receiving output signals of the first logic gate and the second logic gate, and suitable for being reset based on a second bit of the binary code; and a sixth logic gate receiving output signals of the third logic gate and the fourth logic gate, and suitable for being reset based on an inverted signal of the second bit of the binary code.

In accordance with an embodiment of the present invention, a precharge/active flag generation circuit may include: a first stage including first logic gates each of which performs a first logic operation on a corresponding signal among first to $N^{th}$ active signals and a first bit of a bank address, wherein the first to $N^{th}$ active signals represent whether first to $N^{th}$ memory banks are active or not, respectively; and a second stage including second logic gates each of which performs a second logic operation on output signals of the first logic gates and is reset based on a second bit of the bank address.

DETAILED DESCRIPTION

Figure 1:
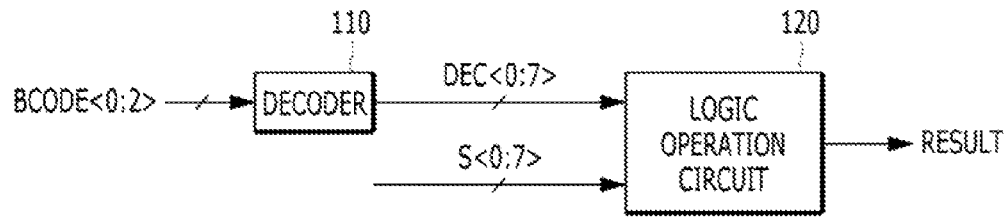
FIG. 1 shows a circuit for performing a logic operation of a binary code and ordinary signals.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
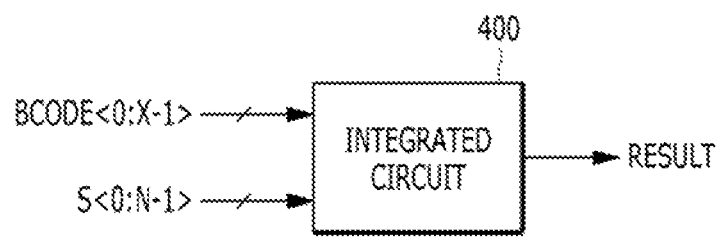
FIG. 4 illustrates a circuit for performing a logic operation of a binary code and ordinary signals in accordance with an embodiment of the present invention.

FIG. 4 illustrates a circuit for performing a logic operation of a binary code BCODE<0:X-1> and N ordinary signals S<0> to S<N-1> that is performed in an integrated circuit 400 in accordance with an embodiment of the present invention.

Referring to FIG. 4, the integrated circuit 400 may receive the binary code BCODE<0:X-1> that is not decoded and the N ordinary signals S<0> to S<N-1>, perform a logic operation on them, and generate a result signal RESULT. In other words, the number of signals obtained by decoding the binary code BCODE<0:X-1> may be the same as the number of the signals S<0> to S<N-1>. Here, the number of bits of the signals S<0> to S<N-1> is N, and the number of bits of the binary code BCODE<0:X-1> is X (i.e., $\log_2 N$).

The integrated circuit 400 performs a decoding operation on the binary code BCODE<0:X-1> and a logic operation on the decoded signals obtained by decoding the binary code BCODE<0:X-1> and the signals S<0> to S<N-1>. Hereafter, the structure and operation of the integrated circuit 400 are described.

Figure 5A:
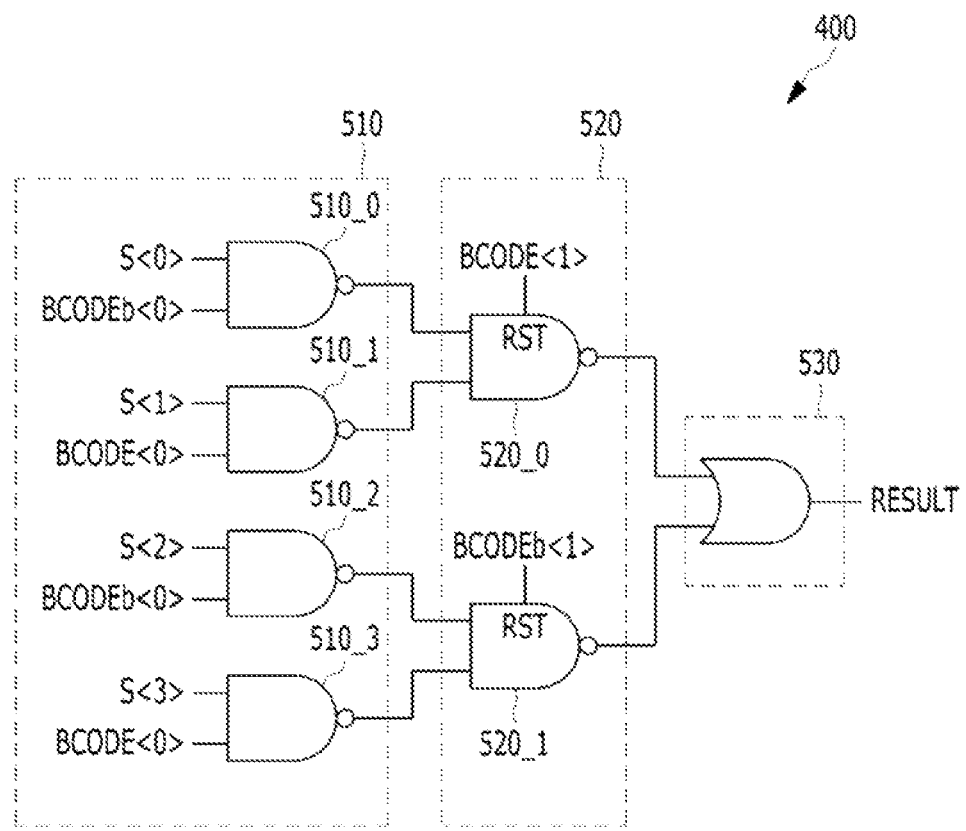
FIG. 5A is a detailed view of an integrated circuit shown in FIG. 4.

FIG. 5A is a detailed view of the integrated circuit 400 shown in FIG. 4. FIG. 5A shows a structure of the integrated circuit 400 in which the number of the bits of the binary code BCODE<0:1> is 2, and the number of the signals S<0> to S<3> is 4.

Referring to FIG. 5A, the integrated circuit 400 may include a first stage 510, a second stage 520, and a third stage 530. Each of the first to third stages 510, 520 and 530 includes logic gates. The number of the logic gates included in each of the first to third stages 510, 520 and 530 is the same as the number (which is 4) of the signals S<0> to S<3> in the first stage 510, and the number of the logic gates may be decreased by half whenever the logic flow goes to the next stage.

The first stage 510 may include 4 logic gates 510_0 to 510_3 which perform a logic operation on one signal among the signals S<0> to S<3> and a first bit BCODE<0> of the binary code BCODE<0:1>. Herein, BCODEb<0> represents an inverted signal of BCODE<0>.

The second stage 520 may include two logic gates 520_0 to 520_1 that perform a logic operation on the operation result of the logic gates 510_0 to 510_3 of the first stage 510. The logic gates 520_0 to 520_1 may be reset based on a second bit BCODE<1> of the binary code BCODE<0:1>. Herein, BCODEb<1> represents an inverted signal of BCODE<1>. The logic gates 520_0 to 520_1 make an output fixed at a logic low level, when the signal of a reset end RST is in a logic high level, Otherwise, the logic gates 520_0 to 520_1 output a result obtained from a logic operation of the input signals.

The third stage 530 may include a logic gate that performs a logic operation on the operation result of the logic gates 520_0 to 520_1 of the second stage 520 and outputs a result signal RESULT.

The decoding operation of the first bit BCODE<0> of the binary code BCODE<0:1> and a logic operation may be performed in the first stage 510. In the second stage 520, the decoding operation of the second bit BCODE<1> of the binary code BCODE<0:1> and a logic operation may be performed. Through the processes, the decoding of the binary code BCODE<0:1> and the logic operation between the decoded signals and other signals S<0> to S<3> may be performed simultaneously in a united circuit.

Figure 5B:
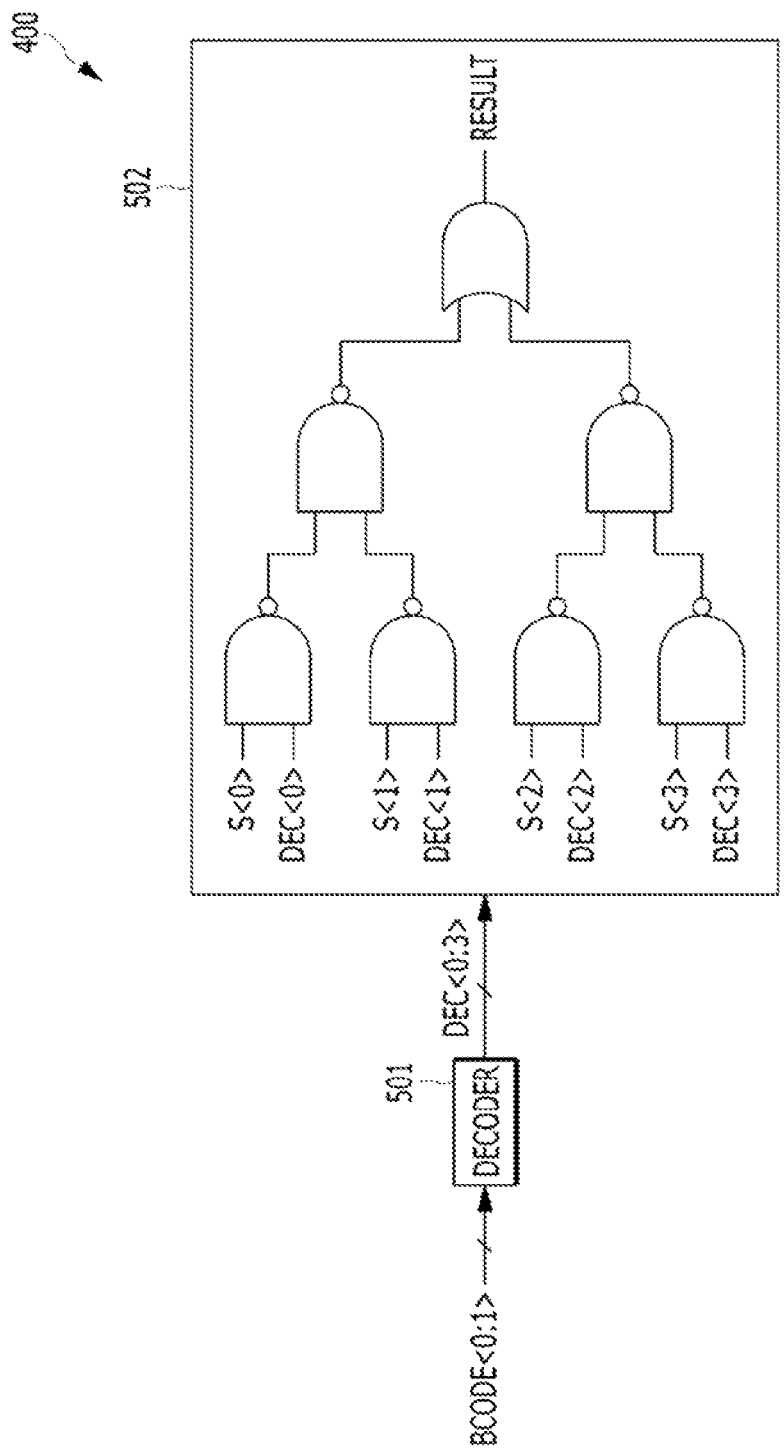
FIG. 5B illustrates an equivalent circuit of the integrated circuit shown in FIG. 5A.

FIG. 5B illustrates an equivalent circuit of the integrated circuit 400 shown in FIG. 5A. It may be seen FIG. 5B that the integrated circuit 400, which is united, performs a decoding operation of the binary code BCODE<0:1> in a decoder 501 and the logic operation on the signals S<0> to S<3> and decoded signals DEC<0> to DEC<3> that are obtained from the decoding operation of the binary code BCODE<0:1> in a logic operation circuit 502.

FIG. 5A shows that the first stage 510 and the second stage 520 include NAND gates, whereas the third stage 530 includes OR gates. The kinds of gates included may be changed according to the kind of logic operation to be performed. Also, although it is illustrated that the least significant bit BCODE<0> of the binary code BCODE<0:1> is used in the first stage 510 and the most significant bit BCODE<1> of the binary code BCODE<0:1> is used in the second stage 520, the least significant bit BCODE<0> of the binary code BCODE<0:1> may be used in the second stage 520 and the most significant bit BCODE<1> of the binary code BCODE<0:1> may be used in the first stage 510.

Figure 6A:
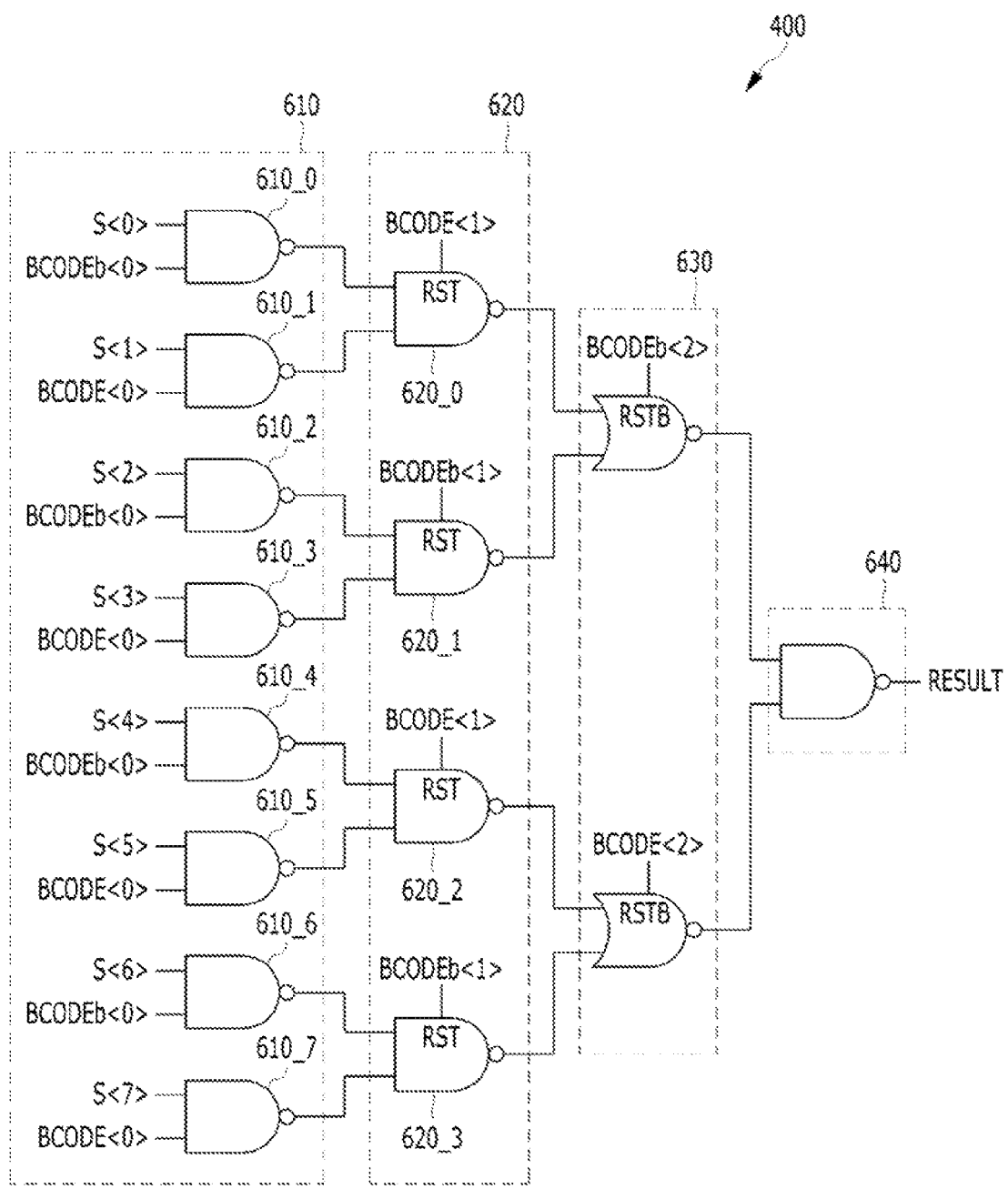
FIG. 6A is a detailed view of an integrated circuit shown in FIG. 4.

FIG. 6A is a detailed view of the integrated circuit 400 shown in FIG. 4. FIG. 6A shows a structure of the integrated circuit 400 when the number of the bits of the binary code BCODE<0:2> is 3, and the number of the signals S<0> to S<7> is 8.

Referring to FIG. 6A, the integrated circuit 400 may include a first stage 610, a second stage 620, a third stage 630, and a fourth stage 640. Each of the first to fourth stages 610, 620, 630 and 640 includes logic gates. The number of logic gates included in each of the first to fourth stages 610, 620, 630 and 640 is the same as the number (which is 8) of signals S<0> to S<7> in the first stage 610, and the number of the logic gates may be decreased by half whenever the logic flow goes to the next stage.

The first stage 610 may include 8 logic gates 610_0 to 610_7, which perform a logic operation on one signal among the signals S<0> to S<7> and a first bit BCODE<0> of the binary code BCODE<0:2>. Herein, BCODEb<0> represents an inverted signal of BCODE<0>.

The second stage 620 may include 4 logic gates 620_0 to 620_3 that perform a logic operation on the operation result of the logic gates 610_0 to 610_7 of the first stage 610. The logic gates 620_0 to 620_3 may be reset based on a second bit BCODE<1> of the binary code BCODE<0:2>. Herein, BCODEb<1> represents an inverted signal of BCODE<1>. The logic gates 620_0 to 620_3 make an output fixed at a logic low level, when the signal of a reset end RST is in a logic high level. Otherwise, the logic gates 620_0 to 620_3 output a result obtained from a logic operation of the input signals.

The third stage 630 may include two logic gates 630_0 to 630_1 that perform a logic operation on the operation result of the logic gates 620_0 to 620_3 of the second stage 620. The logic gates 630_0 to 630_1 may be reset based on a third bit BCODE<2> of the binary code BCODE<0:2>. Herein, BCODEb<2> represents an inverted signal of BCODE<2>. The logic gates 630_0 to 630_1 make an output fixed at a logic high level, when the signal of a reset end RST is in a logic low level. Otherwise, the logic gates 630_0 to 630_1 may output a result obtained from a logic operation of the input signals.

The fourth stage 640 may include a logic gate that performs a logic operation on the operation result of the logic gates 630_0 to 630_1 of the third stage 630 and outputs a result signal RESULT.

The decoding operation of the first bit BCODE<0> of the binary code BCODE<0:2> and a logic operation may be performed in the first stage 610. In the second stage 620, the decoding operation of the second bit BCODE<1> of the binary code BCODE<0:2> and a logic operation may be performed. Through the processes, the decoding of the binary code BCODE<0:2> and the logic operation between the decoded signals and other signals S<0> to S<7> may be performed simultaneously in a united circuit.

Figure 6B:
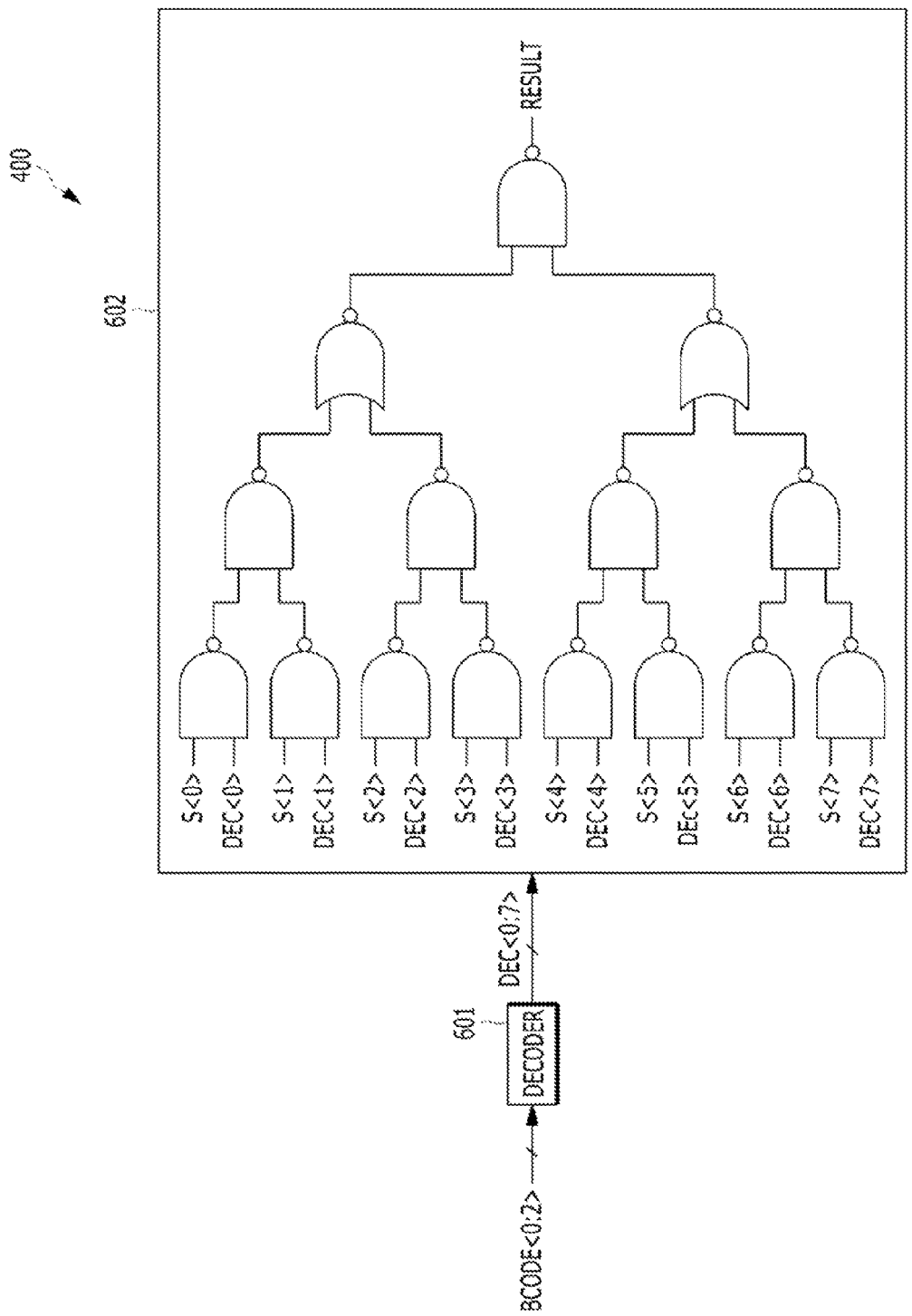
FIG. 6B illustrates an equivalent circuit of the integrated circuit shown in FIG. 6A.

FIG. 6B illustrates an equivalent circuit of the integrated circuit 400 shown in FIG. 6A. It may be seen FIG. 6B that the integrated circuit 400, which is united, performs the decoding operation of the binary code BCODE<0:2> in a decoder 601 and the logic operation between the signals S<0> to S<7> and decoded signals DEC<0> to DEC<7> that are obtained from the decoding operation of the binary code BCODE<0:2> in a logic operation circuit 602.

FIG. 6A shows that the first stage 610 and the second stage 620 include NAND gates, whereas the third stage 630 includes NOR gates and the fourth stage 640 includes NAND gates, The kinds of the included gates may be changed according to the kind of logic operation to be performed. Also, although it is illustrated that the more significant bit of the binary code BCODE<0:2> is used as the order of the stage becomes higher, the sequence of the bits used in the stages may be changed.

Figure 7A:
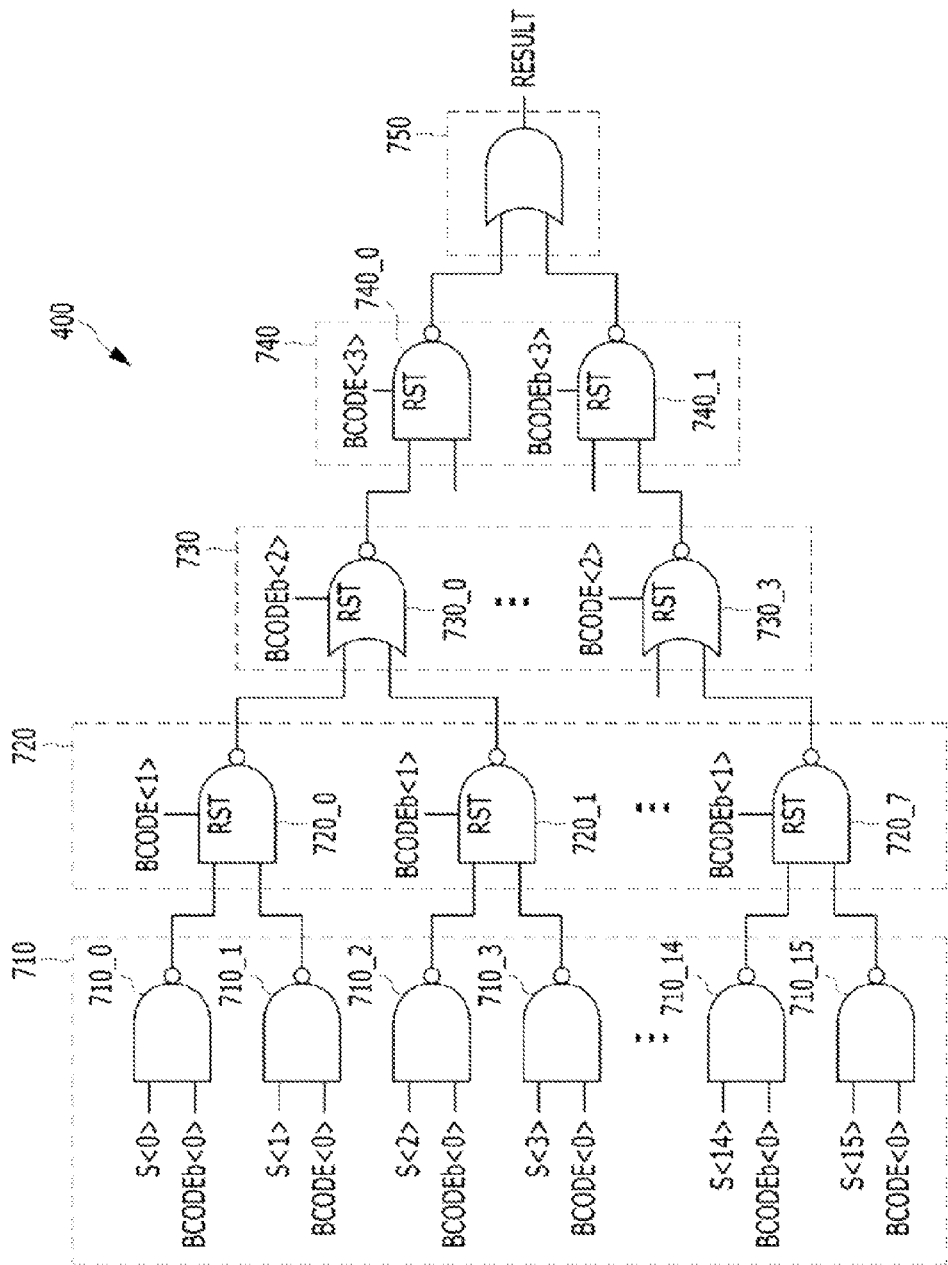
FIG. 7A is a detailed view of an integrated circuit shown in FIG. 4.

FIG. 7A is a detailed view of the integrated circuit 400 shown in FIG. 4. FIG. 7A shows a structure of the integrated circuit 400 when the number of the bits of the binary code BCODE<0:3> is 4, and the number of the signals S<0> to S<15> is 16.

Referring to FIG. 7A, the integrated circuit 400 may include a first stage 710, a second stage 720, a third stage 730, a fourth stage 740, and a fifth stage 750. Each of the first to fifth stages 710, 720, 730, 740 and 750 includes logic gates. The number of logic gates included in each of the first to fifth stages 710, 720, 730, 740 and 750 is the same as the number (which is 16) of the signals S<0> to S<15> in the first stage 710, and the number of the logic gates may be decreased by half whenever the logic flow goes to the next stage.

The first stage 710 may include 16 logic gates 710_0 to 710_15, which perform a logic operation on one signal among the signals S<0> to S<15> and a first bit BCODE<0> of the binary code BCODE<0:3>. Herein, BCODEb<0> represents an inverted signal of BCODE<0>.

The second stage 720 may include 8 logic gates 720_0 to 720_7 that perform a logic operation on the operation result of the logic gates 710_0 to 710_15 of the first stage 710. The logic gates 720_0 to 720_7 may be reset based on a second bit BCODE<1> of the binary code BCODE<0:3>. Herein, BCODEb<1> represents an inverted signal of BCODE<1>. The logic gates 720_0 to 720_7 make an output fixed at a logic low level, when the signal of a reset end RST is in a logic high level. Otherwise, the logic gates 720_0 to 720_7 output a result obtained from a logic operation of the input signals.

The third stage 730 may include 4 logic gates 730_0 to 730_3 that perform a logic operation on the operation result of the logic gates 720_0 to 720_7 of the second stage 720. The logic gates 730_0 to 730_3 may be reset based on a third bit BCODE<2> of the binary code BCODE<0:3>. Herein, BCODEb<2> represents an inverted signal of BCODE<2>. The logic gates 730_0 to 730_3 make an output fixed at a logic high level, when a signal applied to a reset end RST is in a logic low level. Otherwise, the logic gates 730_0 to 730_3 output a result obtained from a logic operation of the input signals.

The fourth stage 740 may include two logic gates 740_0 to 740_1 that perform a logic operation on the operation result of the logic gates 730_0 to 730_3 of the third stage 730. The logic gates 740_0 to 740_1 may be reset based on a fourth bit BCODE<3> of the binary code BCODE<0:3>, Herein, BCODEb<3> represents an inverted signal of BCODE<3>. The logic gates 740_0 to 740_1 make an output fixed at a logic low level, when the signal of a reset end RST is in a logic high level. Otherwise, the logic gates 740_0 to 740_1 may output a result obtained from a logic operation of the input signals.

The fifth stage 750 may include a logic gate that performs a logic operation on the operation result of the logic gates 740_0 to to 740_1 of the fourth stage 740 and outputs a result signal RESULT.

The decoding operation of the first bit BCODE<0> of the binary code BCODE<0:3> and a logic operation may be performed in the first stage 710. In the second stage 720, the decoding operation of the second bit BCODE<1> of the binary code BCODE<0:3> and a logic operation may be performed. Also, in the third stage 730, the decoding operation of the third bit BCODE<2> of the binary code BCODE<0:3> and a logic operation may be performed, and the decoding operation of the fourth bit BCODE<3> of the binary code BCODE<0:3> and a logic operation may be performed in the fourth stage 740. Through the processes, the decoding of the binary code BCODE<0:3> and the logic operation between the decoded signals and other signals S<0> to S<15> may be performed simultaneously in a united circuit.

Figure 7B:
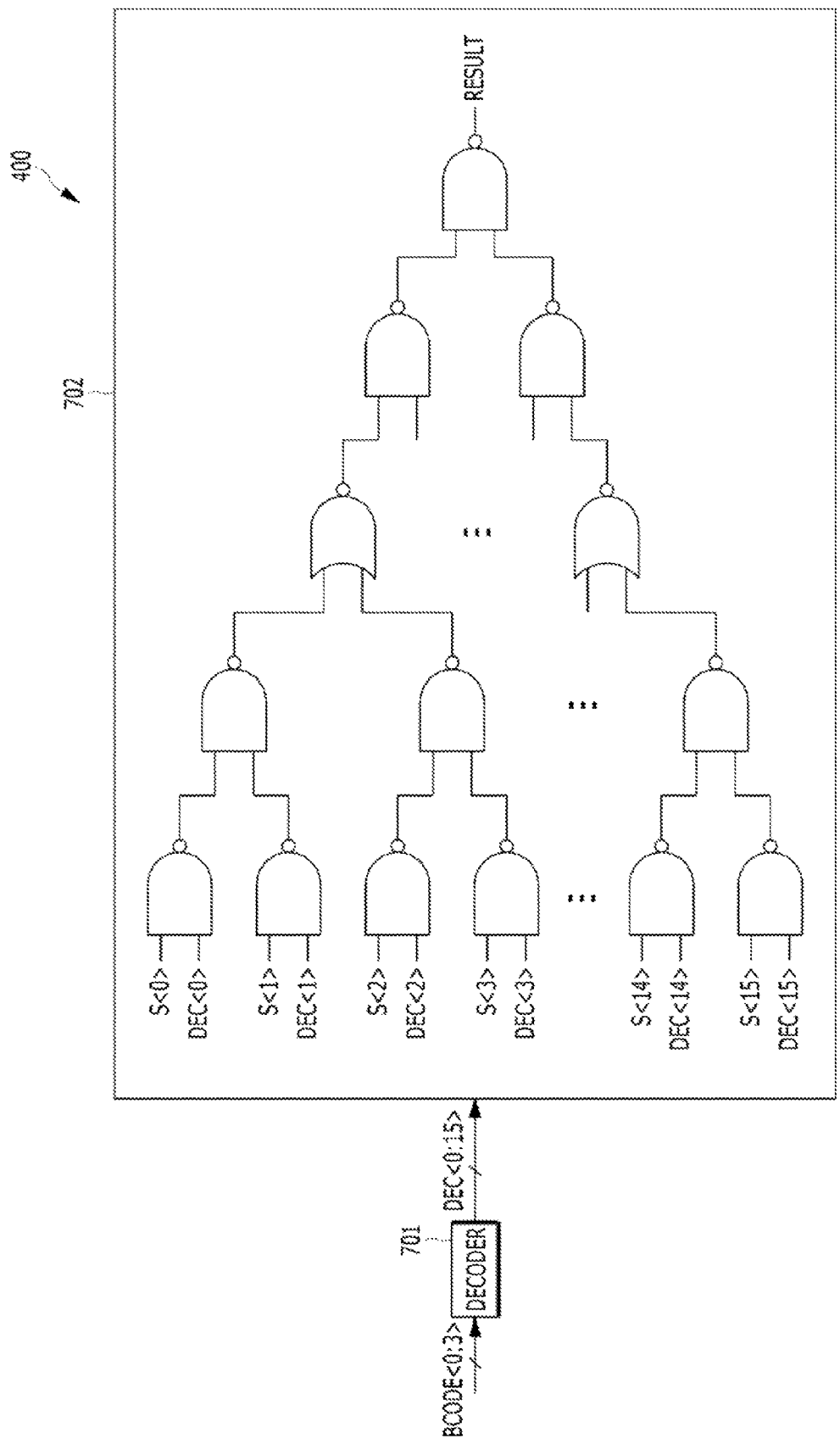
FIG. 7B illustrates an equivalent circuit of the integrated circuit shown in FIG. 7A.

FIG. 7B illustrates an equivalent circuit of the integrated circuit 400 shown in FIG. 7A. It may be seen FIG. 7B that the integrated circuit 400, which is united, performs the decoding operation of the binary code BCODE<0:3> in a decoder 701 and the logic operation between the signals S<0> to S<15> and decoded signals DEC<0> to DEC<15> that are obtained from the decoding operation of the binary code BCODE<0:3> in a logic operation circuit 702.

FIG. 7A shows that the first stage 710 and the second stage 720 include NAND gates, whereas the third stage 730 includes NOR gates and the fourth stage 740 includes NAND gates, and the fifth stage 750 includes OR gates. The kinds of the included gates may be changed according to the kind of logic operation to be performed. Also, although it is illustrated that the more significant bit of the binary code BCODE<0:3> is used as the order of the stage becomes higher, the sequence of the bits used in the stages may be changed.

FIGS. 5A to 7A show the structures of the integrated circuit 400 when the number of the bits of the binary code is 2 bits, 3 bits, and 4 bits. However, the integrated circuit may be designed in the same manner although the number of the bits of the binary code is greater than 2 bits, 3 bits, and 4 bits. For example, when the number of the bits of the binary code BCODE<0:X−1> is X, the integrated circuit 400 includes X+1 stages. Herein, in a first stage, the input signals S<0> to S<$2^X$−1> are logically operated with a first bit of the binary code BCODE<0:X−1>. In second to Xth stages, logic operations are performed on the operation results of the previous stages, and the logic gates of the corresponding stages are reset based on second to X bits of the binary code BCODE<0:X−1. In an X+1th stage, a logic operation is performed on the operation result of an Xth stage.

Referring back to FIGS. 5A, 6A and 7A it may be seen that a portion of the integrated circuit 400 is not changed regardless of the number of the bits of the binary code BCODE<0:X−1>. The portion is the four logic gates 510_0 to 510_3, 610_0 to 610_3 and 710_0 to 710_3 of the first stage 510, 610 and 710, and the two logic gates 520_0 to 520_1, 620_0 to 620_1 and 720_0 to 720_1 of the second stage 520, 620 and 720. These structures may be designed the same even though the number of the bits of the binary code BCODE<0:X−1> is greater than 5.

Figure 8:
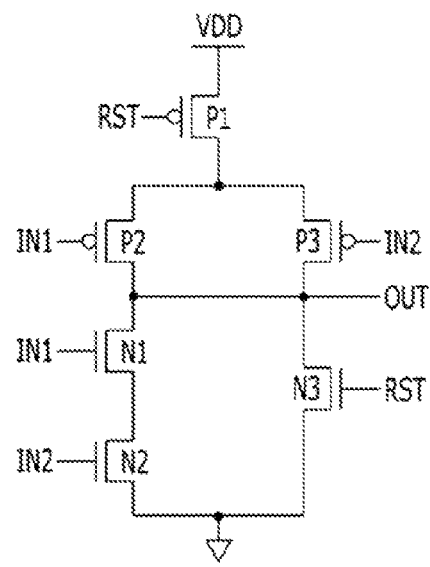
FIG. 8 is a detailed view of a resectable NAND gate shown in FIGS. 5A, 6A and 7A.

FIG. 8 is a block view illustrating a se able NAND gate shown in FIGS. 5A, 6A and 7A.

Referring to FIG. 8, the resettable NAND gate may include PMOS transistors P1 to P3 and NMOS transistors N1 to N3.

When a signal applied to a reset end RST is in a logic low level, the PMOS transistor P1 may be turned on and the NMOS transistor N1 may be turned off, and a general operation of a NAND gate may be performed. In other words, when the input ends IN1 and IN2 are all in a logic high level, the logic level of an output end OUT may become a logic low level. When at least one between the input ends IN1 and IN2 is in a logic low level, the logic level of the output end OUT may become a logic high level.

When the signal applied to the reset end RST is in a logic high level, the PMOS transistor P1 may be turned off and the NMOS transistor N3 may be turned on. Therefore, the logic level of the output end OUT may be fixed to a logic low level regardless of the voltage level of the input ends IN1 and IN2.

Figure 9:
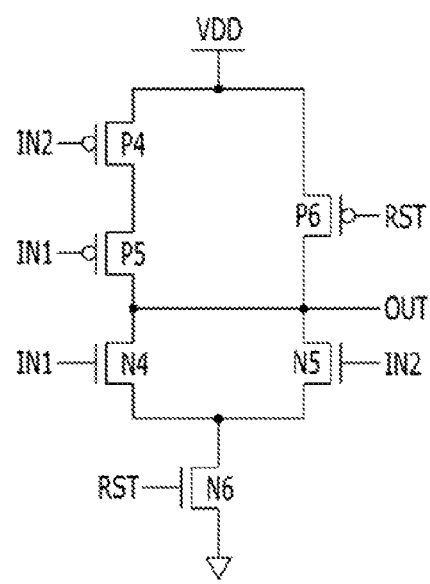
FIG. 9 is a detailed view of a resettable NOR gate shown in FIGS. 6A and 7A.

FIG. 9 is a detailed view of a resettable NOR gate shown in FIGS. 6A and 7A.

Referring to FIG. 9, the resettable NOR gate may include PMOS transistors P4 to P6 and NMOS transistors N4 to N6.

When a signal applied to a reset end RST is in a logic high level, the PMOS transistor P6 may be turned off and the NMOS transistor N6 may be turned on, and a general operation of a NOR gate may be performed. In other words, when at least one between the input ends IN1 and IN2 is in a logic high level, the logic level of the output end OUT may become a logic low level. When the input ends IN1 and IN2 are all in a logic low level, the logic level of an output end OUT may become a logic high level.

When the signal applied to the reset end RST is in a logic low level, the PMOS transistor P6 may be turned on and the NMOS transistor N6 may be turned off. Therefore, the logic level of the output end OUT may be fixed to a logic high level regardless of the voltage level of the input ends IN1 and IN2.

Figure 10:
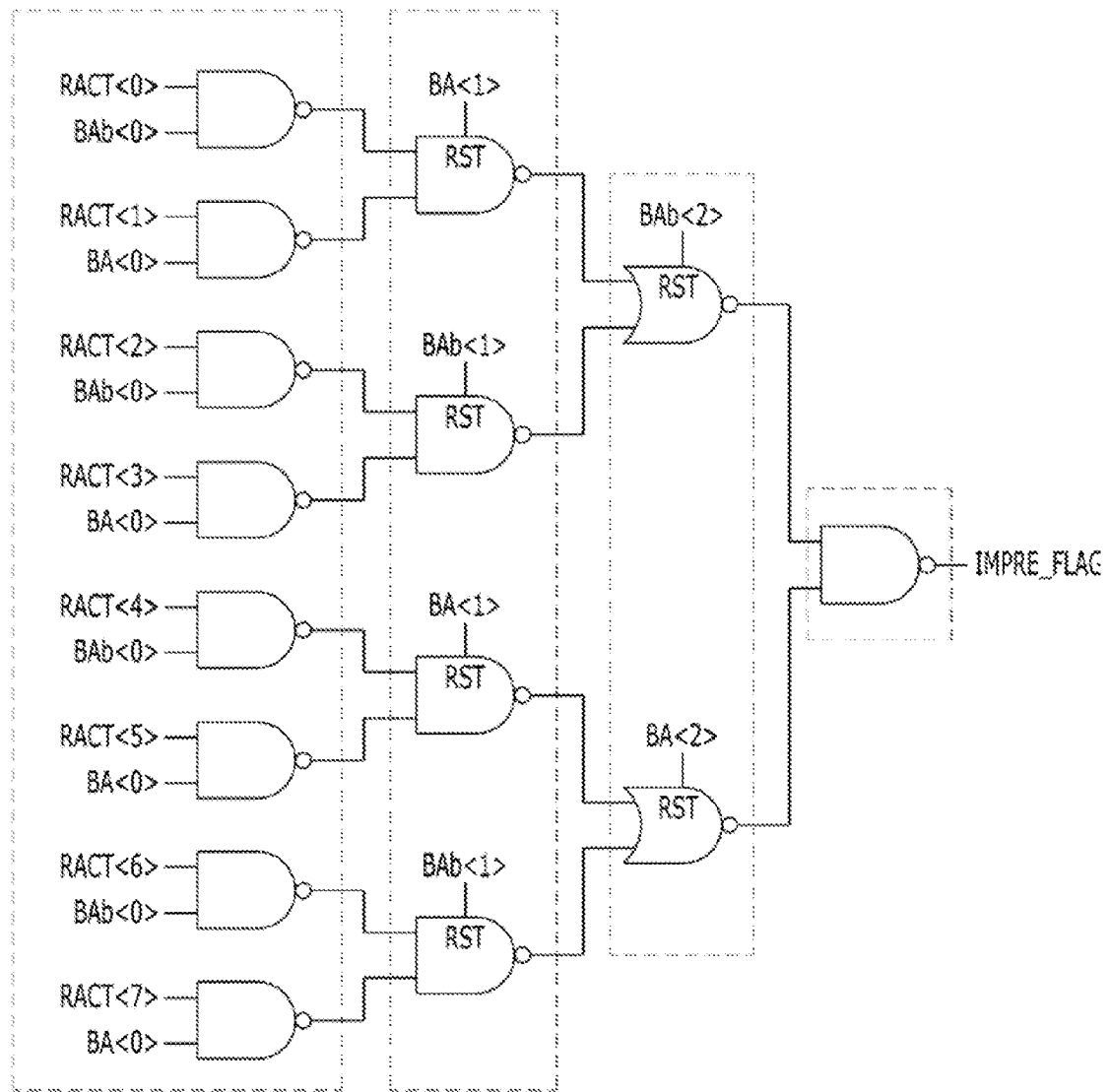
FIG. 10 is a view illustrating a precharge/active flag generation circuit in accordance with an embodiment of the present invention.

FIG. 10 is a view illustrating a precharge/active flag generation circuit in accordance with an embodiment of the present invention.

Figure 2:
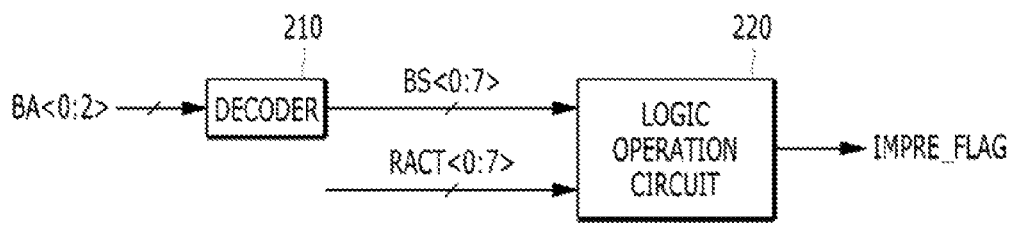
FIG. 2 illustrates a circuit for generating a precharge/active flag signal that is used to support an implicit precharge (imPRE) function in a memory device.
Figure 3A:
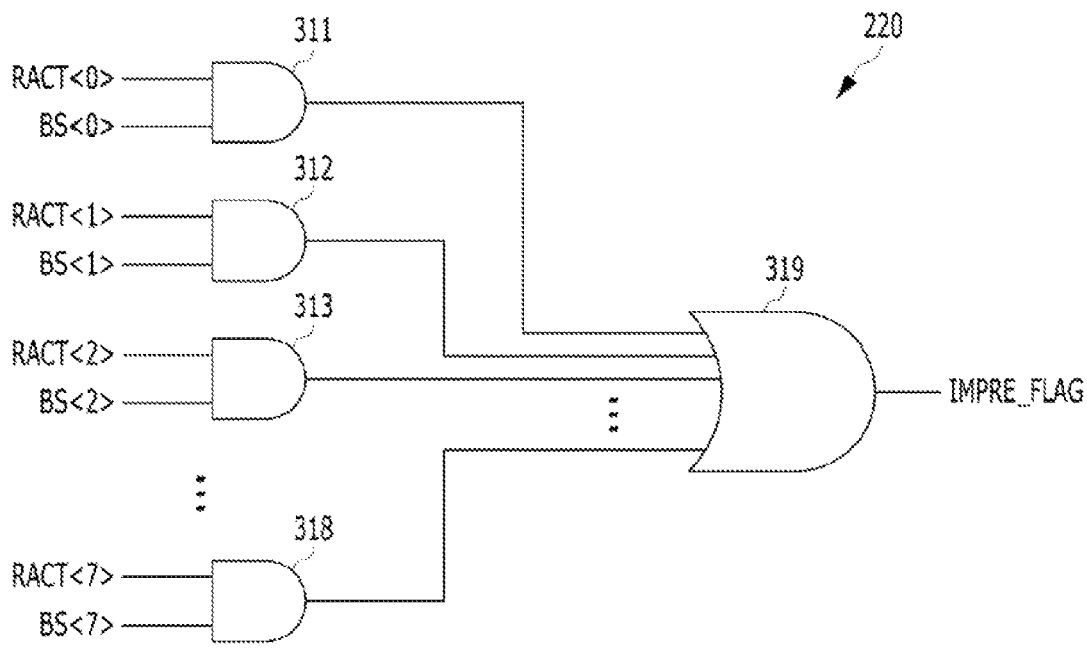
FIGS. 3A and 3B are circuit diagrams of the logic operation circuit 220 shown in FIG. 2.
Figure 3B:
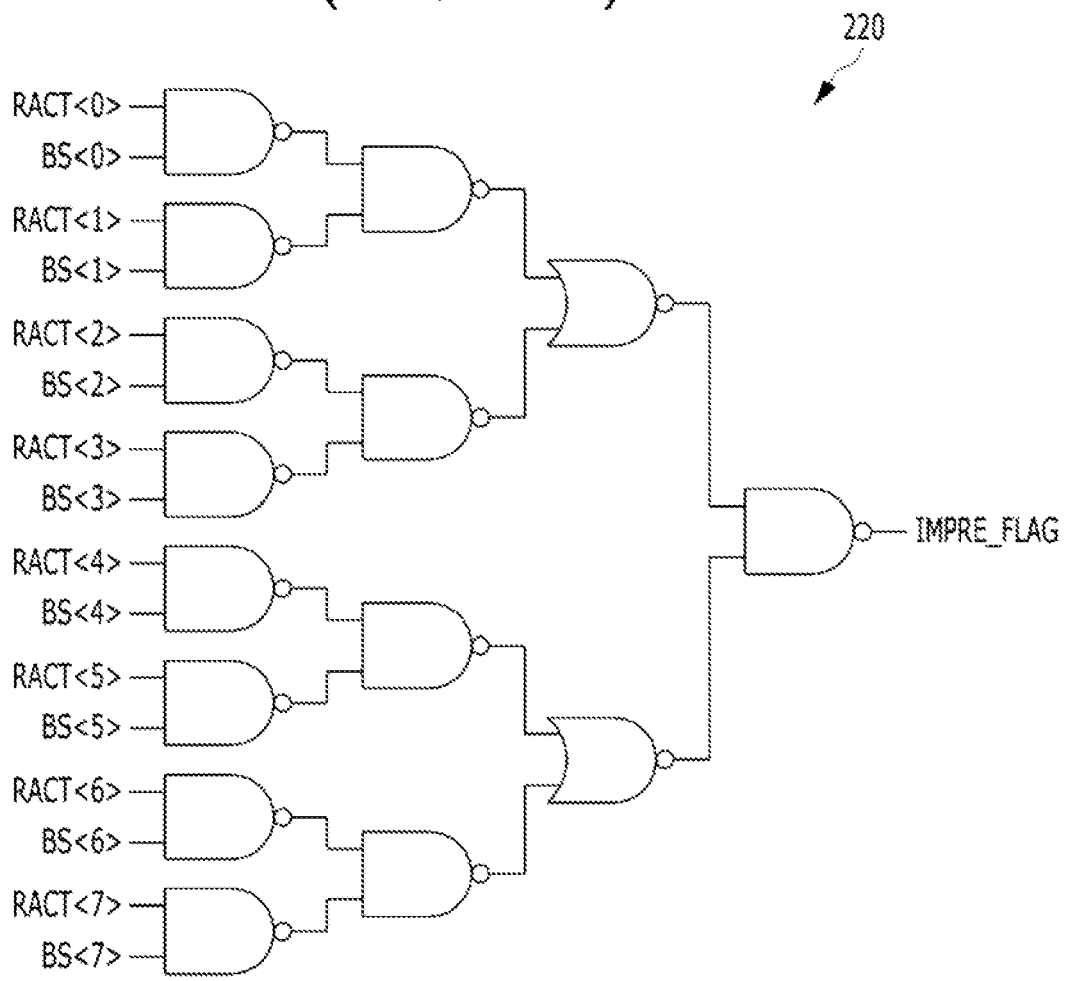

As described with reference to FIGS. 2 and 3, a precharge/active flag signal may be a signal representing whether an active command that is applied to a memory device corresponds to an active bank or a precharged bank.

Referring to FIG. 10, the precharge/active flag generation circuit has a structure in which the binary code BCODE<0:2> of FIG. 6A is replaced with a bank address BA<0:2> and the signals S<0> to S<7> of FIG. 6A are replaced with active signals RACT<0> to RACT<7>. In FIGS. 2 and 3, the decoder 210 for generating bank selection signals BS<0> to BS<7> by decoding the BA<0:2> and the logic operation circuit 220 for performing a logic operation on the bank selection signals BS<0> to BS<7> and the active signals RACT<0> to RACT<7> are required. On the contrary, it may be seen from FIG. 10 that both of the decoding operation and the logic operation are performed simultaneously by a united circuit.

Although FIG. 10 shows the structure of the precharge/active flag generation circuit when the bank address BA<0:2> is formed of 3 bits and the number of banks is 8, a precharge/active flag generation circuit of different types may also be designed in the same manner described with reference to FIGS. 5A and 7A.

In accordance with the embodiments of the present invention, it may be possible to perform a logic operation on a binary code that is not decoded with other signals. In short, decoding of the binary code and a logic operation on the binary code and the other signals may be performed simultaneously.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
 a first stage including first logic gates, each of which performs a first logic operation on a corresponding signal among first to $4^{th}$ signals and a first bit of a binary code;
 a second stage including second logic gates, each of which performs a second logic operation on corresponding output signals of the first logic gates and is reset based on a second bit of the binary code; and
 a third stage including a third logic gate suitable for performing a third logic operation on output signals of the second logic gates,
 wherein the number of the first logic gates is 4, the number of the second logic gates is 2, and the number of bits of the binary code is 2.

2. The integrated circuit of claim 1, wherein the first logic gates are 2-input NAND gates, and
 the second logic gates are 2-input NAND gates.

3. The integrated circuit of claim 1, wherein the second logic gates output the output signals fixed to a predetermined logic level when the second logic gates are reset.

4. An integrated circuit, comprising:
 a first stage including first logic gates, each of which performs a first logic operation on a corresponding signal among first to $8^{th}$ signals and a first bit of a binary code;
 a second stage including second logic gates, each of which performs a second logic operation on corresponding output signals of the first logic gates and is reset based on a second bit of the binary code;
 a third stage including two third logic gates, each of which performs a third logic operation on corresponding output signals of the second logic gates and is reset based on a third bit of the binary code; and
 a fourth stage including a fourth logic gate suitable for performing a fourth logic operation on output signals of the two third logic gates,
 wherein the number of the first logic gates is 8, the number of the second logic gates is 4, and the number of bits of the binary code is 3.

5. An integrated circuit, comprising:
 a first stage including first logic gates, each of which performs a first logic operation on a corresponding signal among first to $N^{th}$ signals and a first bit of a binary code;
 a second stage including second logic gates, each of which performs a second logic operation on corresponding output signals of the first logic gates and is reset based on a second bit of the binary code;
 a third to a $log_2Nth$ stages each including logic gates suitable for performing a logic operation on output signals of logic gates of a previous stage and being reset based on a particular bit of the binary code; and
 a $(log_2N)+1th$ stage including a logic gate suitable for performing a logic operation on output signals of the logic gates of the $log_2Nth$ stage,
 wherein N is equal to $2^Z$, wherein Z is a positive integer and N is greater than or equal to 16.

6. An integrated circuit, comprising:
 a first logic gate receiving an inverted signal of a first bit of a binary code and a first signal;
 a second logic gate receiving the first bit of the binary code and a second signal;
 a third logic gate receiving the inverted signal of the first bit of the binary code and a third signal;
 a fourth logic gate receiving the first bit of the binary code and a fourth signal;
 a fifth logic gate receiving output signals of the first logic gate and the second logic gate, and suitable for being reset based on a second bit of the binary code; and
 a sixth logic gate receiving output signals of the third logic gate and the fourth logic gate, and suitable for being reset based on an inverted signal of the second bit of the binary code.

7. The integrated circuit of claim 6, wherein the fifth logic gate and the sixth logic gate output signals fixed to a predetermined logic level when the fifth logic gate and the sixth logic gate are reset.

8. The integrated circuit of claim 6, wherein the first to fourth logic gates are 2-input NAND gates.

9. The integrated circuit of claim 8, wherein the fifth logic gate and the sixth logic gate are 2-input resettable NAND gates.

10. A precharge/active flag generation circuit, comprising:
 a first stage including first logic gates each of which performs a first logic operation on a corresponding signal among first to $8^{th}$ active signals and a first bit of a bank address, wherein the first to $8^{th}$ active signals represent whether first to $8^{th}$ memory banks are active, respectively; and
 a second stage including second logic gates each of which performs a second logic operation on output signals of the first logic gates and is reset based on a second bit of the bank address;
 a third stage including two third logic gates each of which performs a third logic operation on output signals of the second logic gates and is reset based on a third bit of the bank address; and
 a fourth stage including a fourth logic gate suitable for performing a fourth logic operation on output signals of the two third logic gates to generate a precharge/active flag signal,
 wherein the number of the first logic gates is 8, the number of the second logic gates is 4, and the number of bits of the bank address is 3.

11. The precharge/active flag generation circuit of claim 10, wherein the first logic gates are 2-input NAND gates; the second logic gates are 2-input resettable NAND gates; the third logic gates are 2-input resettable NOR gates; and the fourth logic gate is a 2-input NAND gate.

12. The precharge/active flag generation circuit of claim 10, wherein the second logic gates output signals fixed to a predetermined logic level when the second logic gates are reset.

13. A precharge/active flag generation circuit, comprising:
 a first stage including first logic gates each of which performs a first logic operation on a corresponding signal among first to $16^{th}$ active signals and a first bit of a bank address, wherein the first to $16^{th}$ active signals represent whether first to $16^{th}$ memory banks are active, respectively; and
 a second stage including second logic gates each of which performs a second logic operation on output signals of the first logic gates and is reset based on a second bit of the bank address;
 a third stage including four third logic gates each of which performs a third logic operation on corresponding output signals of the second logic gates and is reset based on a third bit of the bank address;

a fourth stage including two fourth logic gates each of which performs a fourth logic operation on corresponding output signals of the third logic gates and is reset based on a fourth bit of the bank address; and a fifth stage including a fifth logic gate suitable for performing a fifth logic operation on output signals of the two fourth logic gates to generate a precharge/active flag signal, wherein the number of the first logic gates is 16, the number of the second logic gates is 8, and the number of bits of the bank address is 4.

14. The precharge/active flag generation circuit of claim 13, wherein the first logic gates are 2-input NAND gates;

the second logic gates are 2-input resettable NAND gates;

the third logic gates are 2-input resettable NOR gates;

the fourth logic gates are 2-input resettable NAND gates; and the fifth logic gate is an OR gate.

* * * * *